United States Patent [19]
Kokubo

[11] Patent Number: 5,388,069
[45] Date of Patent: Feb. 7, 1995

[54] NONVOLATILE SEMICONDUCTOR MEMORY DEVICE FOR PREVENTING ERRONEOUS OPERATION CAUSED BY OVER-ERASE PHENOMENON

[75] Inventor: Masaya Kokubo, Kasugai, Japan

[73] Assignees: Fujitsu Limited, Kawaski; Fujitsu VLSI Limited, Kasugai, both of Japan

[21] Appl. No.: 34,130

[22] Filed: Mar. 18, 1993

[30] Foreign Application Priority Data

Mar. 19, 1992 [JP] Japan ................................ 4-064162

[51] Int. Cl.⁶ .............................................. G11C 7/00
[52] U.S. Cl. ................................. 365/185; 365/189.09; 365/218; 365/230.03; 365/900
[58] Field of Search ........... 365/185, 900, 218, 189.09, 365/230.03

[56] References Cited

U.S. PATENT DOCUMENTS

| | | | |
|---|---|---|---|
| 5,047,981 | 9/1991 | Gill et al. | 365/900 X |
| 5,065,364 | 11/1991 | Atwood et al. | 365/900 X |
| 5,095,461 | 3/1992 | Miyakawa et al. | 365/900 X |
| 5,241,507 | 8/1993 | Fong | 365/900 X |

*Primary Examiner*—Do Hyun Yoo
*Attorney, Agent, or Firm*—Nikaido, Marmelstein, Murray & Oram

[57] ABSTRACT

A nonvolatile semiconductor memory device has a plurality of word lines, a plurality of bit lines, a plurality of nonvolatile memory cells, and a source power supply circuit. Each of the nonvolatile memory cells is formed of a MIS transistor disposed at each intersection of the word lines and the bit lines, and a threshold voltage of the MIS transistor is externally electrically controllable. The source power supply circuit, which is connected to sources of the nonvolatile memory cells, is used to apply a first voltage to the sources of the nonvolatile memory cells to negate an influence caused by an over-erase phenomenon at the time of a reading operation. In the nonvolatile semiconductor memory device of the present invention, the selected memory cell is surely switched ON, and the non-selected memory cells are surely switched OFF, even though some of the non-selected memory cells are over-erased, because the influence caused by the over-erase phenomenon of the memory cells can be negated by applying the first voltage to the sources of the memory cells. Consequently, in the flash memory of the present invention, the non-selected memory cells are never erroneously selected, and thus the reliability of a flash memory becomes increased.

3 Claims, 6 Drawing Sheets

Fig. 7

| | PRIOR ART (Fig.6A) | PRESENT INVENTION (Fig.6B) |
|---|---|---|
| BL1 | 1 V | 3 V |
| BL2 | OPEN | OPEN |
| WL1 | 5 V | 5 V |
| WL2 | 0 V | 0 V |
| S1 | 0 V | 2 V |

S1 = S2 = S3 = S4

NONVOLATILE SEMICONDUCTOR MEMORY DEVICE FOR PREVENTING ERRONEOUS OPERATION CAUSED BY OVER-ERASE PHENOMENON

BACKGROUND OF THE INVENTION

1. Field of the Invention

The present invention relates to a nonvolatile semiconductor memory device, and more particularly, to a flash type EEPROM (Electrically Erasable Programmable Read Only Memory, and hereafter called a flash memory). In this flash memory, stored information (data) is electrically and collectively erasable, and then the stored information can be rewritten.

2. Description of the Related Art

Recently, in accordance with popularization of computers, word processors, and the like, a plurality of semiconductor memory devices, typically nonvolatile semiconductor memory devices, e.g., flash memory, used in such information processors, have been developed and produced.

The flash memory, which is one kind of nonvolatile semiconductor memory device, can be made programmable by the user. Further, the flash memory can be rewritten by electrically and collectively erasing the stored data, and then by programming. Note, in the flash memory, it is known that an over-erase phenomenon (which will be explained in detail later) may be caused by repeatedly carrying out write/erase operations over a long period of use.

Therefore, in a normal read operation, even though a cell is in a non-selection state, a gate voltage of the over-erased and non-selected cell is increased until the gate voltage exceeds a threshold voltage thereof, and the over-erased and non-selected cell may be erroneously selected, so that erroneous data is read out and a reliability of the flash memory may become low.

SUMMARY OF THE INVENTION

An object of the present invention is to provide a nonvolatile semiconductor memory device which can prevent the over-erase phenomenon caused when collectively erasing data thereof over a long period of use.

According to the present invention, there is provided a nonvolatile semiconductor memory device comprising a plurality of word lines, a plurality of bit lines, a plurality of nonvolatile memory cells each formed of a MIS transistor disposed at each intersection of the word lines and the bit lines, and a threshold voltage of the MIS transistor being externally electrically controllable, and a source power supply circuit, connected to sources of the nonvolatile memory cells, for applying a first voltage to the sources of the nonvolatile memory cells to negate an influence caused by an over-erase phenomenon at the time of a reading operation.

The nonvolatile semiconductor memory device may be constituted by a flash memory. Each of the nonvolatile memory cells may be specified as an N-channel type transistor, and the first voltage of the source power supply circuit may be specified as a specific positive voltage.

The source power supply circuit may comprise a read bias voltage generation circuit for generating the first voltage, a write bias voltage generation circuit for generating a second voltage, an erase bias voltage generation circuit for generating a third voltage, and a power source switching circuit, connected to the read bias voltage generation circuit, the write bias voltage generation circuit, and the erase bias voltage generation circuit, for selecting the first voltage when reading data from the memory cells, the second voltage when writing data to the memory cells, and the third voltage when erasing data of the memory cells.

The nonvolatile semiconductor memory device may further comprise a write and sense amplifier circuit for applying a fourth voltage to drains of the memory cells connected to a selected bit line, at the time of the reading operation. The first voltage may be specified as 2 volts, and the fourth voltage may be specified as 3 volts. The nonvolatile memory cells may be divided into a plurality of blocks, and a plurality of write and sense amplifier circuits may be provided for each of the blocks.

BRIEF DESCRIPTION OF THE DRAWINGS

The present invention will be more clearly understood from the description of the preferred embodiments as set forth below with reference to the accompanying drawings, wherein:

FIG. 7 is a diagram for explaining the differences of operation voltages between the nonvolatile semiconductor memory devices shown in FIGS. 6A and 6B.

DESCRIPTION OF THE PREFERRED EMBODIMENTS

For a better understanding of the preferred embodiments, the problems of the related art will be explained, with reference to FIGS. 1 and 2.

Figure 1:
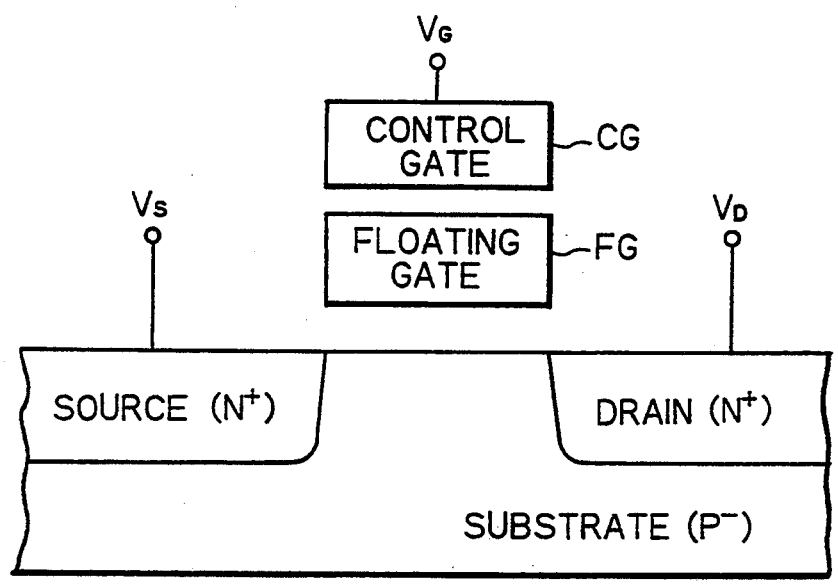
FIG. 1 is a diagram schematically showing a cell transistor of a nonvolatile semiconductor memory device.

FIG. 1 schematically shows a cell transistor of a nonvolatile semiconductor memory device (flash memory). In FIG. 1, reference $V_G$ denotes a gate terminal, $V_D$ denotes a drain terminal, $V_S$ denotes a source terminal, CG denotes a control gate connected to the gate terminal $V_G$, and FG denotes a floating gate controlled by a voltage of the control gate CG. Note, the cell transistor is formed of an N-channel type MOS (MIS) transistor having the control gate CG and the floating gate FG, and a threshold voltage of the MOS transistor is externally electrically controllable, which will be described below in detail.

In the flash memory, when reading data from a selected cell, the source terminal $V_S$ is supplied with 0 volts ($V_{SS}$), the gate terminal $V_G$ is supplied with 5 volts for a reading voltage ($V_{CC}$), and the drain terminal $V_D$ is supplied with 1 volt, respectively, so that data read out from the cell is determined to be "1" or "0" (read operation) in response to whether the cell flows current or not. In this case, gate terminals $V_G$ of non-selected cells are supplied with 0 volts, and drain terminals $V_D$ of the non-selected cells are made opened.

On the other hand, in the flash memory, when writing data into a selected cell, the source terminal $V_S$ is supplied with 0 volts, the gate terminal $V_G$ is supplied with 12 volts for a write/erase voltage $V_{PP}$, and the drain terminal $V_D$ is supplied with a writing drain voltage $V_W$ (which is lower than the write/erase voltage $V_{PP}$), respectively, so that electrons are injected from a drain region into the floating gate FG (write operation). Similarly, in this case, the gate terminals of the non-selected cells are also supplied with 0 volts, and the drain terminals $V_D$ of the non-selected cells are made to be opened.

Further, in the flash memory, when erasing data, regardless of a cell is selected or non-selected, the drain terminal $V_D$ is made to be opened, the gate terminal $V_G$ is supplied with 0 volts ($V_{SS}$), and the source terminal $V_S$ is supplied with 12 volts ($V_{PP}$), respectively, so that electrons are extracted from the floating gate FG to a source region (erase operation).

Figure 2:
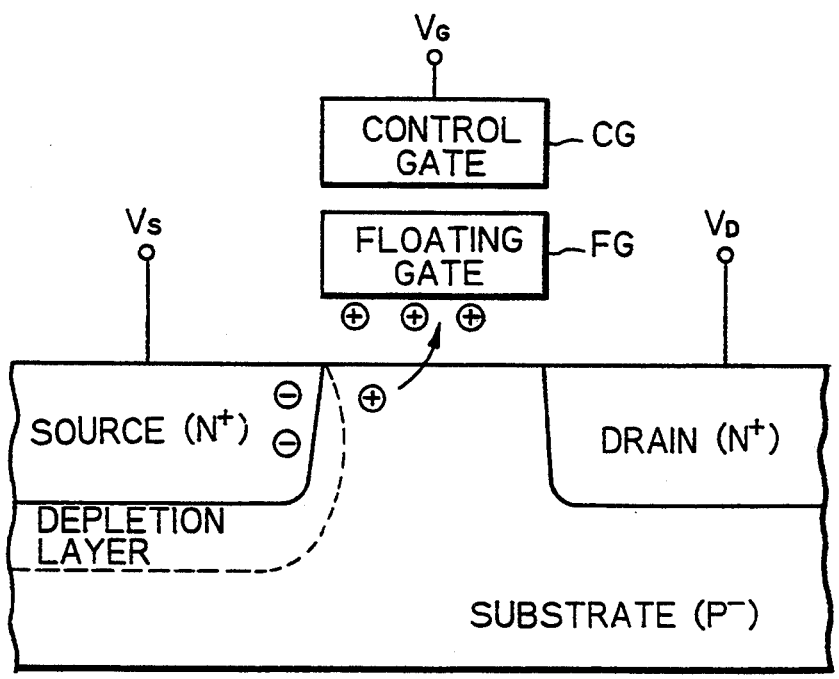
FIG. 2 is a diagram for explaining an over-erase phenomenon caused in the cell transistor shown in FIG. 1.

FIG. 2 is a diagram for explaining an over-erase phenomenon caused in the cell transistor shown in FIG. 1. As shown in FIG. 2, when the erase operation is carried out, in the region close to the floating gate FG of the source region, a state of a depletion layer is changed, an electric field becomes strong, and a plurality of pairs of electrons and holes (+) are caused, so that an inter-band tunneling current is flown. Note, the holes (+) are accelerated by the electric field toward a drain region, and are transferred to the region close to the floating gate FG as indicated by an arrow in FIG. 2. Further, the holes (+) are injected into an oxide film formed between the floating gate FG and a semiconductor substrate, and are held therein. Namely, in the area close to the floating gate FG (or oxide film), positive electric charges (or holes) are stored.

The above phenomenon remarkably appears in accordance with repeatedly carrying out the write/erase operations over a long period of use. Note, the gate terminal $V_G$ is equivalently brought to the state where the positive voltage (+) is charged, without applying a voltage to the gate terminal $V_G$ (or control gate CG) from the external, and this state is called as an over-erase state (or over-erase phenomenon). Consequently, in the read operation, the over-erased memory cell may be erroneously selected without having the reading voltage ($V_{CC}$: 5 volts) applied to the control gate thereof.

In the prior art, to prevent the "over-erase phenomenon", a high voltage value applied to the source terminal $V_S$ of each cell for the erase operation should fluctuate as little as possible.

In the flash memory, when the erase operation is carried out, electrons are collectively extracted from the floating gate FG to the source region in all of the cells, regardless of a cell being selected or non-selected, and thus the above described "over-erase phenomenon" will be caused over a long period of use.

Therefore, in a normal read operation, even though a cell is in a non-selection state, a gate voltage of the over-erased and non-selected cell may be increased until the gate voltage exceeds a threshold voltage thereof, due to a fluctuation of production processes or a change in electric charges existing on the floating gate FG. This problem cannot be prevented by any measure of the prior art, i.e., the way of decreasing the fluctuation of the erase voltage. Consequently, the over-erased and non-selected cell may be erroneously selected, erroneous data may be read out, and the reliability of a flash memory may become low.

Below, the preferred embodiments of a nonvolatile semiconductor memory device according to the present invention will be explained, with reference to the accompanying drawings.

Figure 3:
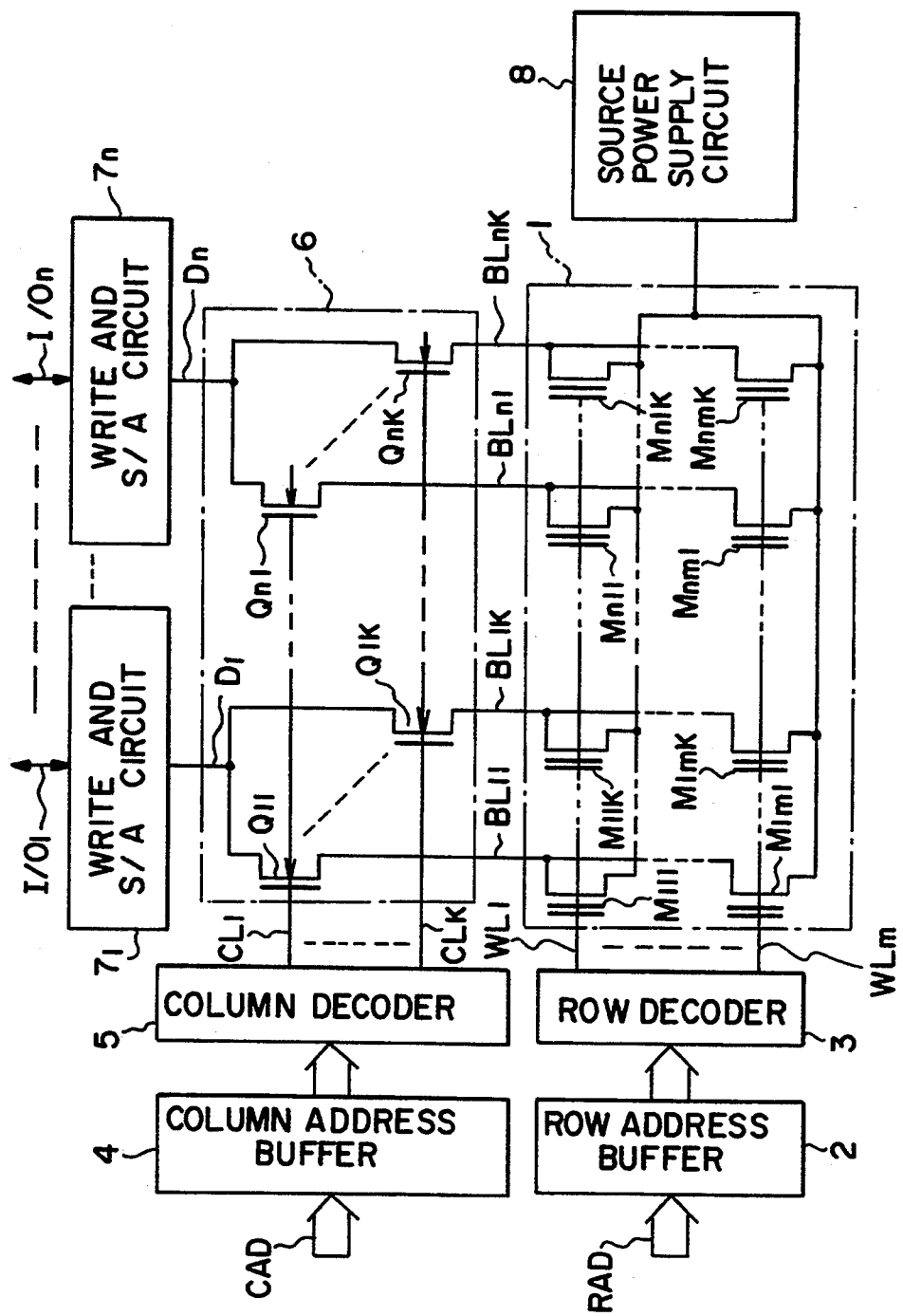
FIG. 3 is a block diagram showing an embodiment of a nonvolatile semiconductor memory device according to the present invention.

FIG. 3 shows an embodiment of a nonvolatile semiconductor memory device (flash memory) according to the present invention. In FIG. 3, reference numeral 1 denotes a memory cell array, 2 denotes a row address buffer, 3 denotes a row decoder, 4 denotes column address buffer, and 5 denotes a column decoder.

The memory cell array 1 comprises a plurality of word lines $WL_1$ to $WL_m$, a plurality of bit lines $BL_{11}$ to $BL_{1k} \sim BL_{n1}$ to $BL_{nk}$, and a plurality of memory cells $M_{hij}$ ($M_{111}$ to $M_{1mk} \sim M_{n11}$ to $M_{nmk}$) each provided at an intersection portion between each of the word lines $WL_1$ to $WL_m$ and each of the bit lines $BL_{11}$ to $BL_{1k} \sim BL_{n1}$ to $BL_{nk}$. In this embodiment, the memory cell array 1 comprises n memory cell blocks, and each of the memory cell blocks comprises $k \times m$ memory cells. Note, each of the memory cells is constituted by a transistor (cell transistor) previously described with reference to FIGS. 1 and 2. Further, as shown in FIGS. 1 and 2, the memory cell $M_{hij}$ is formed of an N-channel type MOS (MIS) transistor having a control gate (CG) and a floating gate (FG), and a threshold voltage of the MOS transistor is externally electrically controllable.

The row address buffer 2 receives a row address RAD, and thereby a specific one word line is selected from the word lines $WL_1$ to $WL_m$ through the row decoder 3. The column address buffer 4 receives a column address CAD, and thereby a specific one bit line of the bit lines $BL_{11}$ to $BL_{1k} \sim BL_{n1}$ to $BL_{nk}$ in each memory cell block is selected through the column decoder 5. Namely, the column decoder 5 selects one column line from a plurality of column lines $CL_1$ to $CL_k$ corresponding to the bit lines $BL_{11}$ to $BL_{1k} \sim BL_{n1}$ to $BL_{nk}$.

Further, in FIG. 3, references $7_1$ to $7_n$ denote write and sense amplifier circuits (write and S/A circuits) provided for the memory cell blocks, $D_1$ to $D_n$ denotes data lines, $I/O_1$ to $I/O_n$ denotes input/output data lines, 6 denotes a column gate circuit, and 8 denotes a source power supply circuit. The column gate circuit 6 comprises a plurality of selection gate transistors $Q_{11}$ to $Q_{1k} \sim Q_{n1}$ to $Q_{nk}$ corresponding to the bit lines $BL_{11}$ to $BL_{1k} \sim BL_{n1}$ to $BL_{nk}$.

For example, when the column line $CL_1$ is selected, the selection gate transistors $Q_{11}$, $Q_{21}$, ..., $Q_{n1}$ are switched ON, and the bit lines $BL_{11}$, $BL_{21}$, ..., $BL_{n1}$ are selected. Further, for example, when the word line $WL_1$ is selected, the memory cells $M_{111}$, $M_{211}$, ..., $M_{n11}$ provided between the selected word line $WL_1$ and the selected bit lines $BL_{11}$, $BL_{21}$, ..., $BL_{n1}$ are connected to the write and S/A (sense amplifier) circuits $7_1$ to $7_n$ through the data lines $D_1$ to $D_n$, respectively. Consequently, data stored in the selected memory cells $M_{111}$, $M_{211}$, ..., $M_{n11}$ are read out by the write and S/A circuits $7_1$ to $7_n$ to the input/output data lines $I/O_1$ to $I/O_n$, and otherwise, data input from the input/output data lines $I/O_1$ to $I/O_n$ are written into the selected memory cells $M_{111}$, $M_{211}$, ..., $M_{n11}$ by the write and S/A circuits $7_1$ to $7_n$.

In FIG. 3, a reference Vs denotes a source voltage of the memory cells $M_{hij}$ ($M_{111}$ to $M_{1mk} \sim M_{n11}$ to $M_{nmk}$) which is commonly applied to source electrodes of all of the memory cells (memory cell transistors) by the source power supply circuit 8. Note, this source voltage Vs is changed in accordance with operation modes of the flash memory. Namely, in this embodiment, the source voltage Vs is specified as an erase voltage (extremely high voltage $V_{pp}$: 12 volts) when erasing data of the memory cells, and the source voltage Vs is specified as a low power supply voltage ($V_{ss}$: 0 volts) when writing data thereto. Further, in this embodiment, the source voltage Vs is specified as a predetermined positive voltage (for example, 2 volts) when reading data from the memory cells, to negate an influence caused by the holes (+) held in the oxide film between the floating gate FG and the semiconductor substrate, or to negate an influence caused by the over-erase phenomenon of the memory cell.

Figure 4:
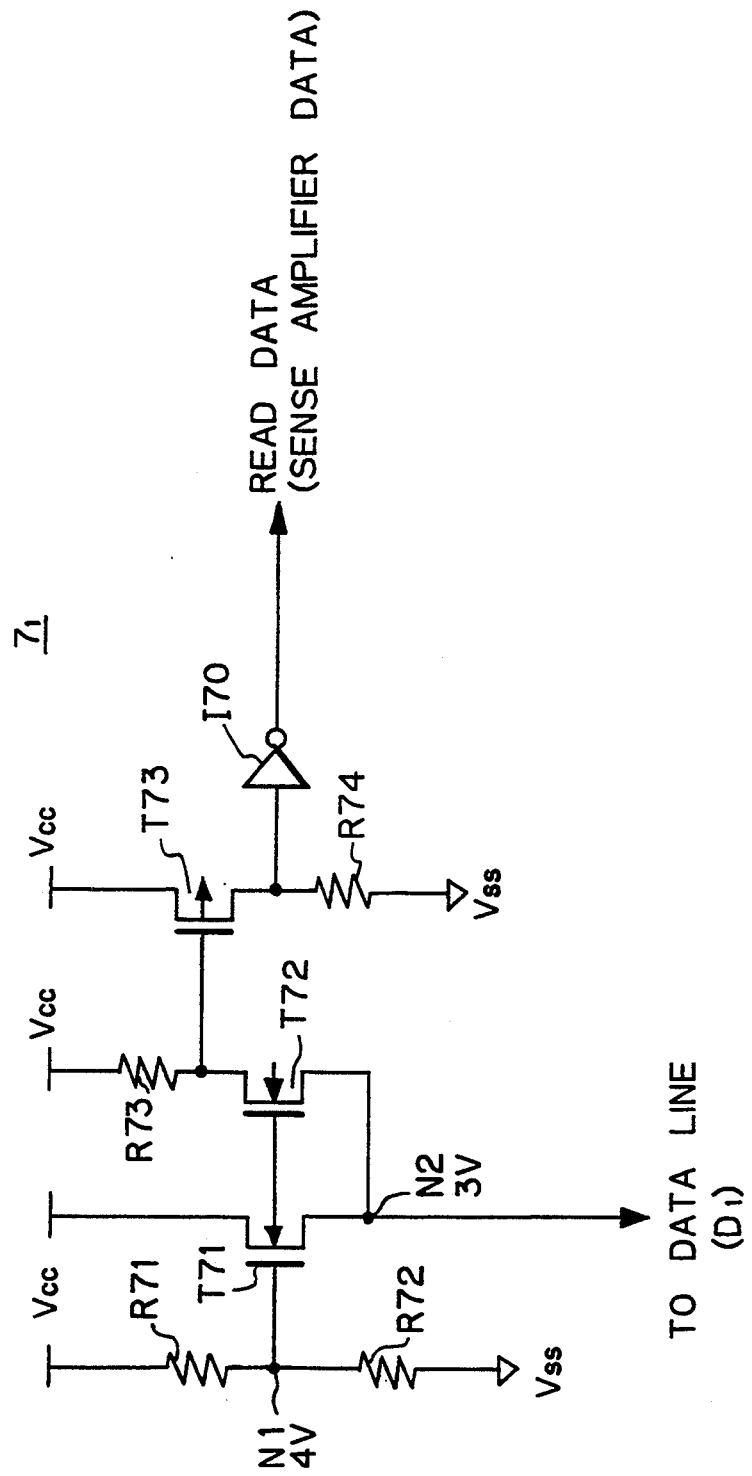
FIG. 4 is a circuit diagram showing a write and S/A circuit of the nonvolatile semiconductor memory device shown in FIG. 3.
Figure 5:
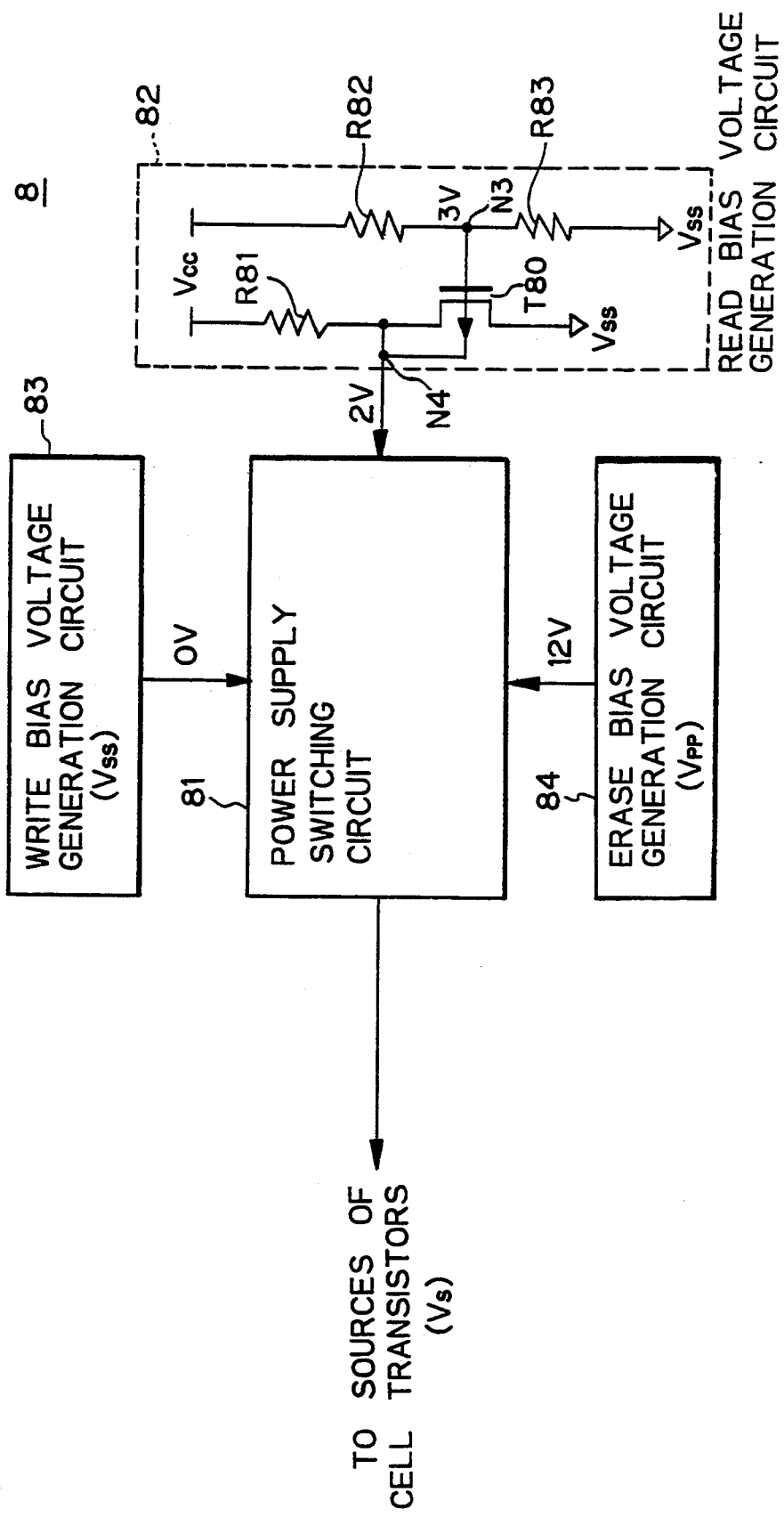
FIG. 5 is a circuit block diagram showing a source power supply circuit of the nonvolatile semiconductor memory device shown in FIG. 3.

FIG. 4 shows the write and S/A circuit $7_1$, and FIG. 5 shows the source power supply circuit 8 of the flash memory shown in FIG. 3.

As shown in FIG. 4, the write and S/A (sense amplifier) circuit $7_1$, which has the same configuration as each of the write and S/A circuits $7_1$ to $7_n$, comprises resistors R71, R72, R73, and R74, N-channel type MOS (MIS) transistors T71 and T72, a P-channel type MOS transistor T73, and an inverter I70. In the write and S/A circuit $7_1$, for example, a potential (voltage) of a node N1, which is a connection portion of the resistors R71 and R72, is specified as 4 volts, and a potential of a node N2 is specified as 3 volts, when reading data from the memory cell array 1 (memory cells $M_{111}$ to $M_{1mk}$). Note, the node N2, which is a connection portion of drains of the transistors T71 and T72, is connected to the data line $D_1$, and an output signal of the inverter I70 is read data (sense amplifier data) corresponding to the input/output data line $I/O_1$. Therefore, when the read operation is carried out, a voltage of drains of the memory cells connected to the selected bit line is, for example, brought to 3 volts.

As shown in FIG. 5, the source power supply circuit 8 comprises a power source switching circuit 81, a read bias voltage generation circuit 82, a write bias voltage generation circuit 83, and an erase bias voltage generation circuit 84.

The power source switching circuit 81 is used to select outputs of the circuits 82, 83, and 84 in accordance with the operation state of the flash memory. Namely, when reading data from the memory cell array 1, an output (for example, 2 volts) of the read bias voltage generation circuit 82 is selected and output to sources of the cell transistors $M_{111}$ to $M_{1mk}$ ($M_{111}$ to $M_{1mk} \sim M_{n11}$ to $M_{nmk}$). Further, when writing data into the memory cell array 1, an output (for example, $V_{SS}$: 0 volts) of the write bias voltage generation circuit 83 is selected and output to the sources of the cell transistors $M_{111}$ to $M_{1mk}$, and when collectively erasing the memory cell array 1, an output (for example, $V_{pp}$: 12 volts) of the erase bias voltage generation circuit 84 is selected and output to the sources of the cell transistors $M_{111}$ to $M_{1mk}$. Note, the write bias voltage generation circuit 83 may be simply constituted by a low power supply $V_{ss}$ (0 volts).

As shown in FIG. 5, the read bias voltage generation circuit 82 comprises resistors RS1, R82, and R83, and P-channel type MOS transistor T80. In the read bias voltage generation circuit 82, for example, a potential of a node N3, which is a connection portion of the resistors R82 and R83, is specified as 3 volts, and a potential of a node N4 is specified as 2 volts. As described above, when reading data from the memory cell array 1, the output (2 volts) of the read bias voltage generation circuit 82 is selected and applied to the sources of the cell transistors $M_{111}$ to $M_{1mk}$ by the power supply switching circuit 81. Namely, when reading data from the memory cell array 1, the voltage of each of the sources of the cell transistors $M_{111}$ to $M_{1mk}$ is at 2 volts, and an influence caused by the holes (+) held in the oxide film between the floating gate FG and the semiconductor substrate of the over-erased memory cell can be negated, so that the over-erased and non-selected cell must not be erroneously selected.

Figure 6A:
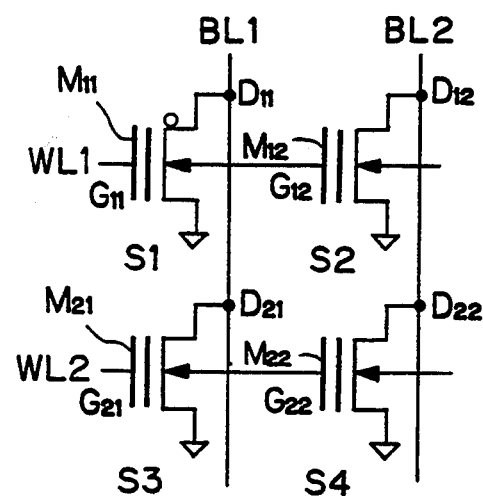
FIG. 6A is a circuit diagram for explaining a read operation in a nonvolatile semiconductor memory device according to the prior art.
Figure 6B:
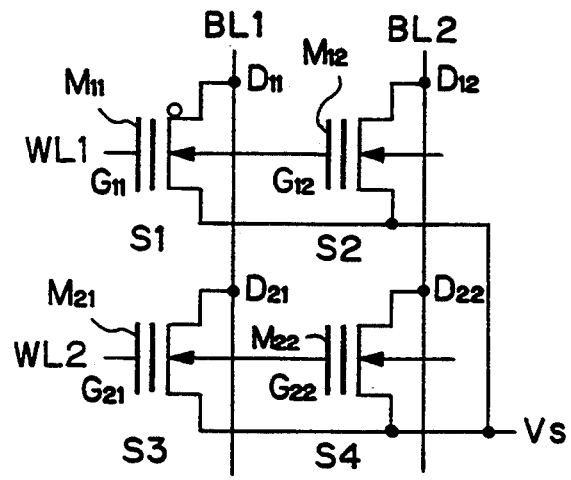
FIG. 6B is a circuit diagram for explaining a read operation in a nonvolatile semiconductor memory device according to the present invention.

FIG. 6A is a circuit diagram for explaining a read operation in the flash memory according to the prior art, FIG. 6B is a circuit diagram for explaining a read operation in a flash memory according to the present invention, and FIG. 7 is a diagram for explaining the differences of operation voltages between the flash memories shown in FIGS. 6A and 6B. In FIGS. 6A and 6B, a reference $M_{11}$ denotes a selected cell (selected memory cell), and references $M_{12}$, $M_{21}$, and $M_{22}$ denote non-selected cells. Note, in FIGS. 6A and 6B, only four memory cells $M_{11}$, $M_{12}$, $M_{21}$, $M_{22}$ are described to simplify the explanation.

As shown in FIGS. 6A and 7, with reference to FIGS. 1 and 2 and corresponding explanations, in the flash memory according to the prior art, when reading data from the selected cell $M_{11}$, source terminals S1, S2, S3, S4 of all of the cells $M_{11}$, $M_{12}$, $M_{21}$, $M_{22}$ are supplied with 0 volts ($V_{SS}$), gate terminals $G_{11}$, $G_{12}$ of the cells $M_{11}$, $M_{12}$, connected to a selected word line WL1 are supplied with 5 volts ($V_{CC}$), and gate terminals $G_{21}$, $G_{22}$ of the cells $M_{21}$, $M_{22}$ connected to a non-selected word line WL2 are supplied with 0 ($V_{SS}$). Further, drain terminals $D_{11}$, $D_{21}$ of the cells $M_{11}$, $M_{21}$ connected to a selected bit line BL1 are supplied with 1 volt, and drain terminals $D_{12}$, $D_{22}$ of the cells $M_{12}$, $M_{22}$ connected to a non-selected bit line BL2 are made opened. Therefore, for example, if the non-selected cell $M_{21}$ is at an over-erased cell, the non-selected cell $M_{21}$ may be erroneously selected by the over-erase phenomenon explained with reference to FIGS. 1 and 2 above.

On the other hand, as shown in FIGS. 6B and 7, in the flash memory according to the present invention, when reading data from the selected cell $M_{11}$, source terminals S1, S2, S3, S4 of all of the cells $M_{11}$, $M_{12}$, $M_{21}$, $M_{22}$ are supplied with 2 volts which is the output voltage of the read bias voltage generation circuit 82 shown in FIG. 5, gate terminals $G_{11}$, $G_{12}$, of the cells $M_{11}$, $M_{12}$ connected to a selected word line WL1 are supplied with 5 volts ($V_{CC}$), and gate terminals $G_{21}$, $G_{22}$ of the cells $M_{21}$, $M_{22}$ connected to a non-selected word line WL2 are supplied with 0 ($V_{SS}$). Further, drain terminals $D_{11}$, $D_{21}$ of the cells $M_{11}$, $M_{21}$ connected to a selected bit line BL1 are supplied with 3 volts which is the output voltage of the write and S/A circuit $7_1$ ($7_1$ to $7_n$), and drain terminals $D_{12}$, $D_{22}$ of the cells $M_{12}$, $M_{22}$ connected to a non-selected bit line BL2 are to be made opened.

Therefore, according to the present invention, for example, if the non-selected cell $M_{21}$ is an over-erased cell, the non-selected cell $M_{21}$ must not be erroneously selected, as the influence caused by the holes (over-erase phenomenon) held in the oxide film between the floating gate FG and the semiconductor substrate of the over-erased memory cell can be negated by applying a specific positive voltage (2 volts) to the source terminal S3 of the non-selected cell $M_{21}$. Note, the voltage (3 volts) of the drain terminals $D_{11}$, $D_{21}$ of the cells $M_{11}$, $M_{21}$ connected to the selected bit line BL1 is determined to suitably carry out the selection operation of the memory cells. Namely, in the flash memory of the prior art, the selected bit line voltage (BL1: drain voltage) is at 1 volt which is higher by 1 volt than the source voltage (0 volts), similarly, in the flash memory of the present invention, the selected bit line voltage (BL1: drain voltage) is at 3 volts which is higher by 1 volt than the source voltage (2 volts), and thereby the selection operations of the memory cells of both flash memories (prior art and present invention) can be suitably carried out.

Note, in the nonvolatile semiconductor memory device according to the present invention, the erase and write operations of the prior art can be applied. Namely, the present invention can be applied to various types of nonvolatile semiconductor memory devices. For example, the present invention can be applied to a flash memory, where an erase operation is carried out by applying 5 volts to sources of memory cells, −5 volts to gates thereof, and by making drains of the memory cells to be opened.

As described above, in the flash memory of the present invention, the selected memory cell $M_{11}$ is surely switched ON, and the non-selected memory cells $M_{12}$, $M_{21}$, $M_{22}$ are surely switched OFF, even though some of the non-selected memory cells are over-erased, because the influence caused by the over-erase phenomenon of the memory cells can be negated by applying a specific positive voltage (2 volts) to the sources of the memory cells. Consequently, in the flash memory of the present invention, the non-selected memory cells are never erroneously selected, and thus the reliability of a flash memory becomes increased.

Many different embodiments of the present invention may be constructed without departing from the spirit and scope of the present invention, and it should be understood that the present invention is not limited to the specific embodiments described in this specification, except as defined in the appended claims.

I claim:

1. A nonvolatile semiconductor memory device comprising:
    a plurality of word lines;
    a plurality of bit lines;
    a plurality of nonvolatile memory cells each formed of a MIS transistor disposed at each intersection of said word lines and said bit lines, and a threshold voltage of said MIS transistor being externally electrically controllable; and
    a source power supply circuit, connected to sources of said nonvolatile memory cells, for applying one of a first voltage, a second voltage, and a third voltage to said sources of said nonvolatile memory cells, said first voltage being applied to negate an influence caused by an over-erase phenomenon at the time of a reading operation, said second voltage being used to write data to said memory cells, and said third voltage being used to erase data of said memory cells, said source power supply circuit comprising:
    a read bias voltage generation circuit for generating said first voltage;
    a write bias voltage generation circuit for generating said second voltage;
    an erase bias voltage generation circuit for generating said third voltage; and
    a power source switching circuit, said power source switching circuit being connected to said read bias voltage generation circuit, said write bias voltage generation circuit, and said erase bias voltage generation circuit for selecting said first voltage when reading data from said memory cells, said second voltage when writing data to said memory cells, and said third voltage when erasing data of said memory cells.

2. A nonvolatile semiconductor memory device as claimed in claim 1, wherein said nonvolatile semiconductor memory device further comprises a write and sense amplifier circuit for applying a fourth voltage to drains of said memory cells connected to a selected bit line, at the time of said reading operation.

3. A nonvolatile semiconductor memory device as claimed in claim 2, wherein said first voltage is specified as 2 volts, and said fourth voltage is specified as 3 volts.

* * * * *